United States Patent
Mochizuki et al.

(10) Patent No.: US 9,305,781 B1
(45) Date of Patent: Apr. 5, 2016

(54) STRUCTURE AND METHOD TO FORM LOCALIZED STRAIN RELAXED SIGE BUFFER LAYER

(71) Applicant: International Business Machines Corporation, Armonk, NY (US)

(72) Inventors: Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/700,609

(22) Filed: Apr. 30, 2015

(51) Int. Cl.
  H01L 21/02 (2006.01)
  H01L 21/265 (2006.01)
  H01L 21/266 (2006.01)
  H01L 21/324 (2006.01)

(52) U.S. Cl.
  CPC ...... *H01L 21/02694* (2013.01); *H01L 21/0245* (2013.01); *H01L 21/02532* (2013.01); *H01L 21/266* (2013.01); *H01L 21/26513* (2013.01); *H01L 21/324* (2013.01)

(58) Field of Classification Search
  CPC ............... H01L 21/02109; H01L 21/02296; H01L 21/02345; H01L 21/02436; H01L 21/02499; H01L 21/02518; H01L 21/70; H01L 21/702; H01L 21/71
  See application file for complete search history.

(56) References Cited

U.S. PATENT DOCUMENTS

| | | | |
|---|---|---|---|
| 7,186,626 B2 * | 3/2007 | Xie | B82Y 10/00 257/E21.12 |
| 7,208,354 B2 | 4/2007 | Bauer | |
| 7,208,357 B2 | 4/2007 | Sadaka et al. | |
| 7,396,747 B2 | 7/2008 | Boyd et al. | |
| 7,416,965 B2 | 8/2008 | Mantl et al. | |
| 7,494,902 B2 | 2/2009 | Jurczak et al. | |
| 2007/0298549 A1 * | 12/2007 | Jurczak | H01L 21/845 438/149 |
| 2014/0179062 A1 * | 6/2014 | Chang | H01L 21/56 438/113 |

OTHER PUBLICATIONS

Hong et al., "Formation of flat, relaxed Si 1-x Ge x alloys on Si (001) without buffer layers", Applied physics letters, 88(12), pp. 122103-1 to 122103-3 (2006).
Hu et al., "Controlling dislocation positions in silicon germanium (SiGe) buffer layers by local oxidation", Thin Solid Films 518 pp. S217-S221 (2010).

(Continued)

*Primary Examiner* — Cheung Lee
(74) *Attorney, Agent, or Firm* — Harrington & Smith

(57) ABSTRACT

A method includes forming a multilayered structure by providing a substrate having a semiconductor layer disposed on a top surface thereof, the semiconductor layer containing misfit dislocations and associated threading dislocations. The method further includes depositing a tensile strained dielectric layer on a top surface of the semiconductor layer to induce a compressive strain in the semiconductor layer and annealing the multilayered structure to cause the misfit dislocations and associated threading dislocations to propagate within the semiconductor layer. The method further immobilizes the propagating misfit dislocations and associated threading dislocations in a predetermined portion of the semiconductor layer. A multilayered structure formed by the method is disclosed wherein a semiconductor layer contains misfit dislocations and associated threading dislocations that are immobilized within a predetermined portion of the semiconductor layer, where other portions of the semiconductor layer surrounding the predetermined portion are locally strain relaxed portions.

14 Claims, 7 Drawing Sheets

(56) References Cited

OTHER PUBLICATIONS

Liu et al., "Trenches in SiO2 Substrate for Relaxation of SiGe Films on SOI Wafers", IP.com No. 000020343, Nov. 14, 2003.

Yin et al., "Buckling suppression of SiGe islands on compliant substrates", Journal of Applied Physics 94(10) pp. 6875-6882 (2003).

Park et al., "Thin strained layers inserted in compositionally graded SiGe buffers and their effects on strain relaxation and dislocation", Journal of Applied Physics 101, pp. 053501-1 to 053501-4 (2007).

* cited by examiner

STRUCTURE AND METHOD TO FORM LOCALIZED STRAIN RELAXED SIGE BUFFER LAYER

TECHNICAL FIELD

The embodiments of this invention relate generally to semiconductor devices and fabrication techniques and, more specifically, relate to the fabrication of semiconductor transistor devices including FINFETs. The embodiments also relate to the localized removal of threading dislocations in a layer of semiconductor material, such as SiGe, on a lattice-mismatched substrate.

BACKGROUND

FIG. 1A shows an enlarged cross-sectional view (not to scale) of a semiconductor substrate, e.g., a Silicon substrate 10, having an overlying layer of semiconductor material, e.g., an epitaxially deposited SiGe epilayer or film 12. The SiGe epilayer 12 can be referred to as a buffer layer. A problem that currently exists relates to a presence of threading dislocations (4) within the SiGe buffer layer 12.

FIG. 1B depicts the presence of the threading dislocations that arise from a presence of misfit dislocations that exist at the interface of the substrate surface and a bottom surface of the SiGe epilayer. In this example the substrate 10 is a Si{100} layer and the threading dislocations exist in the SiGe epilayer and extend towards and to the top surface of the SiGe epilayer.

Some problems that are associated with the threading dislocations (4) include the use of thick (e.g., about a few microns or greater) SiGe buffer layer thickness (1); a rough surface (2) due to the presence of a cross hatch pattern that arises as a result of the threading dislocations; only a partial relaxation (3) of the strain (degree of strain relaxation <100%); and a high threading dislocation density. These problems can negatively affect the growth of further layers on the SiGe buffer layer 12 and can adversely impact the quality of semiconductor devices that are subsequently formed.

SUMMARY

In a first aspect thereof the embodiments of this invention provide a method that comprises forming a multilayered structure by providing a substrate having a semiconductor layer disposed on a top surface thereof, the semiconductor layer containing misfit dislocations and associated threading dislocations. The method further comprises depositing a tensile strained dielectric layer on a top surface of the semiconductor layer to induce a compressive strain in the semiconductor layer and annealing the multilayered structure to cause the misfit dislocations and associated threading dislocations to propagate within the semiconductor layer. The method further immobilizes the propagating misfit dislocations and associated threading dislocations in a predetermined portion of the semiconductor layer.

In another aspect thereof the embodiments of this invention provide a multilayered structure that comprises a substrate having a semiconductor layer disposed on a top surface thereat and a tensile strained dielectric layer disposed on a top surface of the semiconductor layer. In the multilayered structure the semiconductor layer contains misfit dislocations and associated threading dislocations that are immobilized within a predetermined portion of the semiconductor layer, where other portions of the semiconductor layer surrounding the predetermined portion are locally strain relaxed portions.

BRIEF DESCRIPTION OF THE SEVERAL VIEWS OF THE DRAWINGS

FIG. 3 shows a $Si_{1-x}Ge_x$ film layer (epilayer) disposed on a surface of a Silicon substrate;

FIG. 4 shows a tensile stressed SiN layer disposed on top of the SiGe layer of FIG. 3;

FIG. 5 depicts the structure of FIG. 4 after annealing to enhance the strain relaxation of the SiGe layer and cause a propagation of the misfit dislocation and the associated threading dislocations;

FIG. 6 shows a result of an additional anneal to further enhance the strain relaxation and anneal out the threading dislocations, thereby resulting in a thin, strain relaxed SiGe buffer layer;

FIG. 7 illustrates a tensile SiN patterning and annealing embodiment and shows the patterning of the SiN layer to form an aperture;

FIG. 8 shows a result of annealing the structure of FIG. 7 to cause the misfit dislocations to propagate with the associated threading dislocations, and the trapping of the propagating misfit and threading dislocations in that portion of the SiGe layer that underlies the aperture where no tensile stress is applied;

FIG. 9 illustrates the structure of FIG. 8 after removal of the SiN layer, where locally strain relaxed regions can be used as active device fabrication regions;

FIG. 10 illustrates a dual stress liner patterning (tensile and compressive) and annealing embodiment, and shows a result of deposition of the tensile silicon nitride layer with the aperture (as in FIG. 7), followed by deposition of a compressive silicon nitride layer over the tensile silicon nitride layer and into the aperture;

FIG. 11 shows the selective removal of the compressive silicon nitride layer except for within the aperture;

FIG. 12 shows the result of annealing the structure of FIG. 11 to cause the misfit dislocations to propagate, with the associated threading dislocations, into the region of the SiGe layer that underlies the aperture where they are immobilized;

FIG. 13 shows the structure of FIG. 12 after removal of the tensile SiN layer and the compressive SiN layer, where the locally strain relaxed regions can be used as active device fabrication regions;

FIG. 14 illustrates a tensile SiN patterning, implantation and annealing embodiment, and shows a result of the deposition of the tensile silicon nitride layer with the aperture as in FIG. 7;

FIG. 15 shows an ion implant operation where ions are implanted into the SiGe layer through the aperture;

FIG. 16 shows the result of annealing the structure of FIG. 15 to cause the misfit dislocations to propagate, with the associated threading dislocations, into the implanted region of the SiGe layer that underlies the aperture where they are immobilized; and FIG. 17 illustrates, after removal of the SiN layer, that the locally strain relaxed regions can be used as the active device fabrication regions.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in implementing the embodiments of this invention include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process typically ranges from about 550° C. to about 900° C. Although higher temperature typically results in faster deposition, the faster deposition may result in crystal defects and film cracking.

Figure 1A:
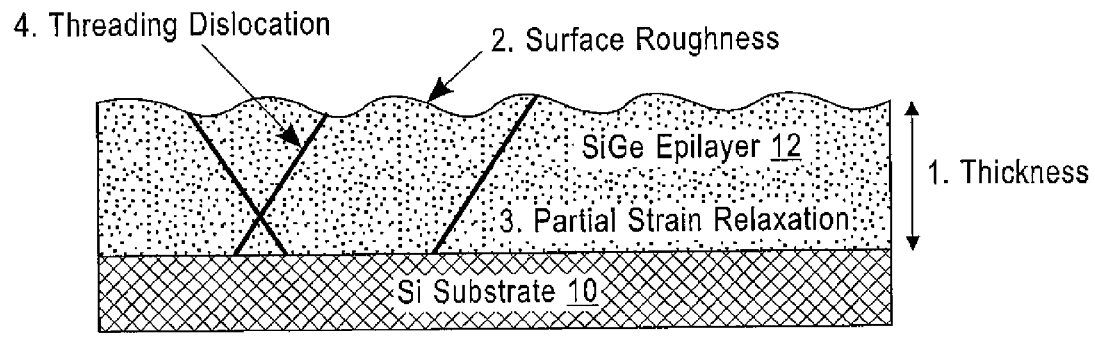
FIG. 1A shows an enlarged cross-sectional view (not to scale) of a semiconductor substrate having an overlying layer of semiconductor material that contains threading dislocations.
Figure 1B:
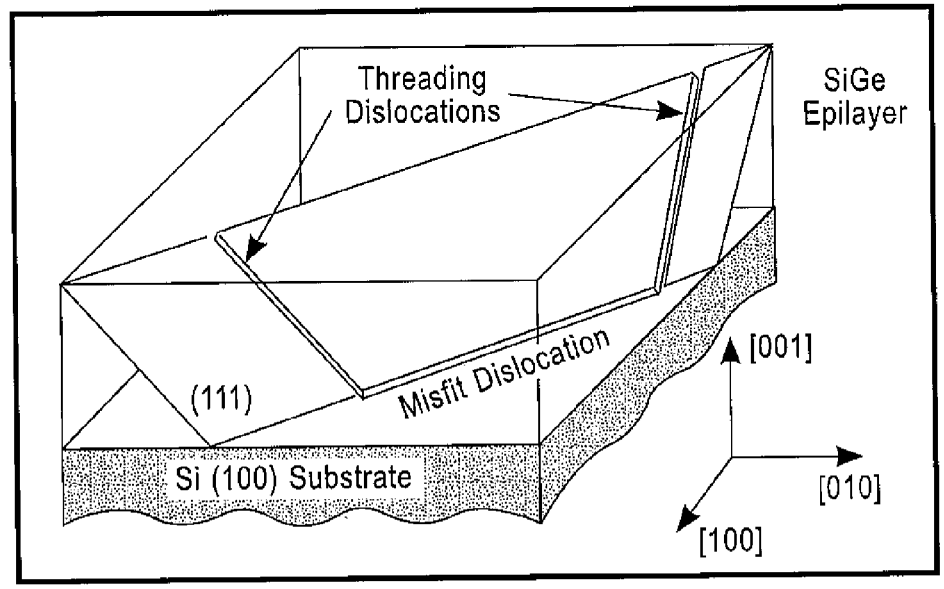
FIGS. 1B and 2 each depict and are useful when explaining the presence of the threading dislocations that arise from a presence of misfit dislocations.
Figure 2:
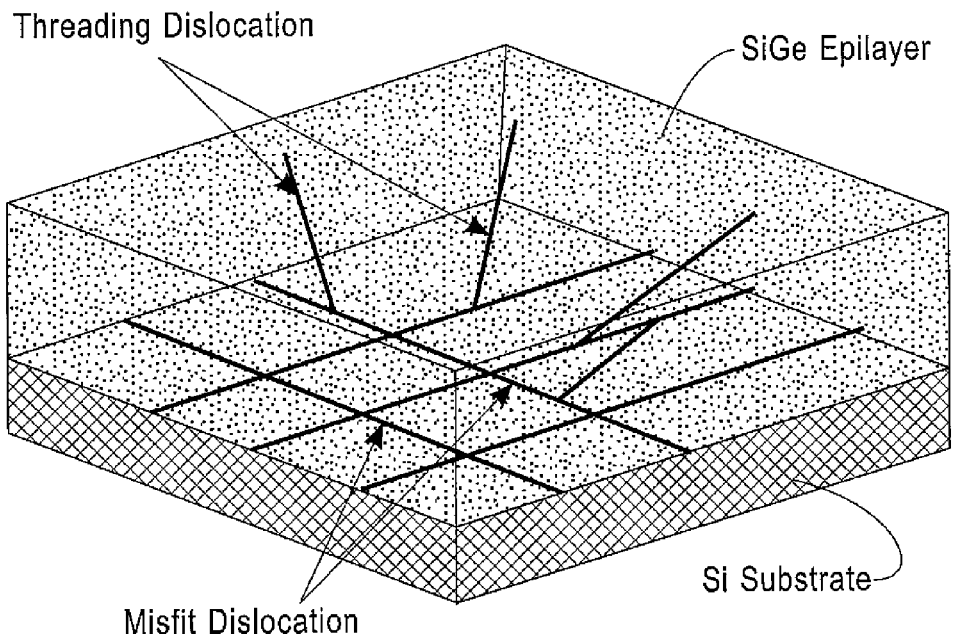

Referring again to FIGS. 1A and 1B, in addition to FIG. 2, the misfit dislocations need to propagate in order to enhance strain relaxation. It is also important to reduce the threading dislocation density in the SiGe film 12. However, the propagation of the misfit dislocations will be suppressed due to reduction of residual stress in the SiGe film 12, resulting in end parts of the misfit dislocations becoming "stuck" as threading dislocation components.

In accordance with one non-limiting aspect of this invention the propagation of misfit dislocations can be enhanced by applying additional stress into the SiGe film 12 that is induced from external material. It can be shown that compressive stress is a driving force for the propagation of misfit dislocations in the SiGe film 12.

Figure 3:
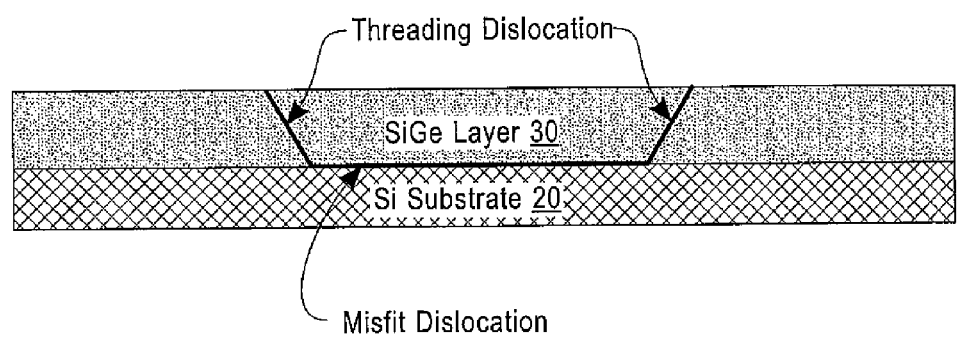
FIGS. 3-17 are each an enlarged cross-sectional view (not to scale) of structures that are employed to realize the various embodiments of this invention, where

In accordance with non-limiting aspects of this invention, and referring to FIG. 3, a process starts with blanket epitaxial growth to form a $Si_{1-x}Ge_x$ film layer (epilayer) 30 on a surface of a Silicon substrate 20. The $Si_{1-x}Ge_x$ layer 30 could have a Ge percentage of, for example, 20%-40% (i.e., x=0.2 to 0.4), and could have a thickness in a range of, by example only, about 250 nm, or thinner, to about 1000 nm, or thicker. The above-described misfit dislocations and threading dislocations will be present in the $Si_{1-x}Ge_x$ layer 30. In other embodiments the epilayer 30 could be a Silicon layer or a Germanium layer or a Group III-V layer.

Figure 4:
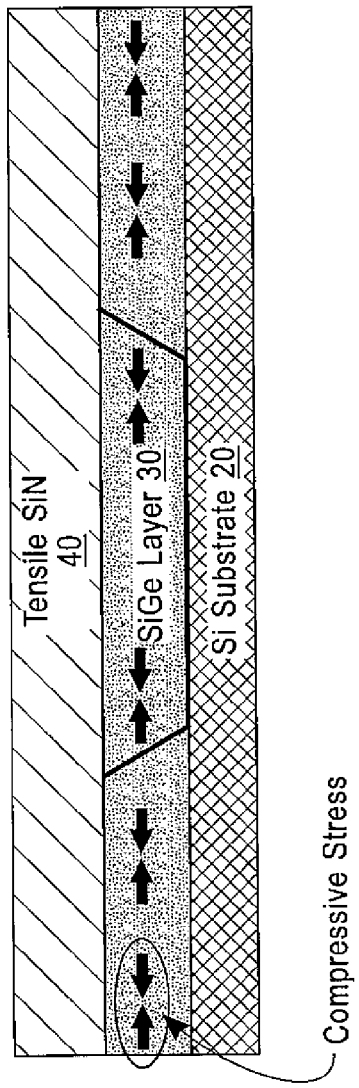

Referring to FIG. 4, on top of the SiGe layer 30 a tensile stressed SiN layer or film 40 is deposited. The SiN layer 40 could have a thickness in a range of, for example, 10 nm to several µm, depending at least in part on the amount of strain that exists in the SiGe layer 30 as deposited. The tensile stressed SiN layer 40 induces compressive stress in the SiGe layer 30.

Various techniques to deposit, such as by chemical vapor deposition (CVD), stressed (tensile or compressive) SiN films are known in the art. In general, the type and amount of stress can be set by adjusting the Si/N relative concentrations and growth and/or substrate temperatures.

Figure 5:
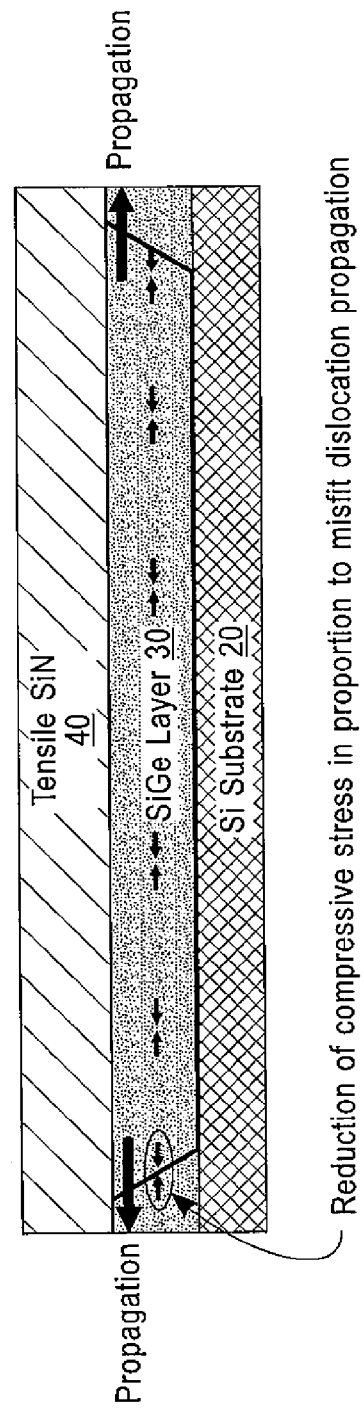

Referring to FIG. 5, the structure formed thus far is annealed to enhance the strain relaxation and cause a propagation of the misfit dislocation and the associated threading dislocations. The reduction in the compressive force in the SiGe layer 20 is proportional to the misfit dislocation propagation.

Figure 6:
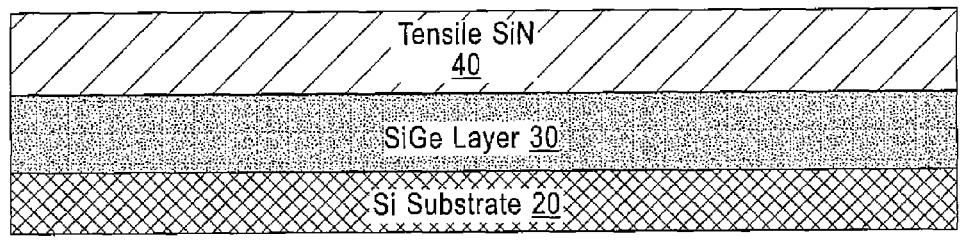

Referring to FIG. 6, an additional anneal can be performed to enhance strain relaxation and anneal out the threading dislocations. The end result is the formation of a thin, strain relaxed SiGe buffer layer 30 with a smooth surface, a high degree of strain relaxation and a low threading dislocation density. The SiN layer 40 can then be removed and fabrication processing can continue as desired.

These and other anneal steps referred to herein can be accomplished, as non-limiting examples, at a temperature in a range of about 800° C. to about 1100° C. (depending on the Ge percentage) for a period of time in a range of about 10 seconds to about 10 minutes.

Various additional embodiments can be adapted from the embodiment shown in FIGS. 3-6 to form the localized thin strain relaxed SiGe buffer layer structure. These include, as described below, the use of tensile SiN patterning and annealing, dual stress liner patterning (tensile and compressive) and annealing; and tensile SiN patterning, implantation and annealing.

Figure 7:
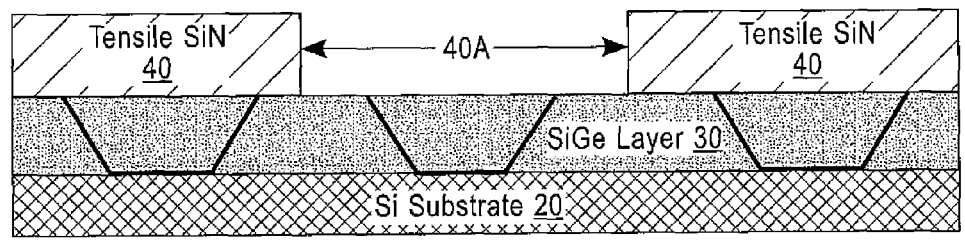

The tensile SiN patterning and annealing embodiment will be described first. Processing begins in a manner compatible with the steps shown in FIGS. 3 and 4. FIG. 7 shows a result of the patterning of the SiN layer 40 and the selective removal of a portion of the SiN layer 40 to form an aperture 40A that exposes a portion of the top surface of the SiGe layer 30. Note that FIG. 7 shows a plurality of misfit dislocations and associated threading dislocations in the SiGe layer 30.

In other embodiments the top surface of the SiGe layer 30 could be masked where the aperture 40A is desired, the SiN layer 40 deposited, and then the mask and the overlying SiN material could be removed (lifted-off) to expose the surface of the SiGe layer 30 and form the aperture 40A.

Figure 8:
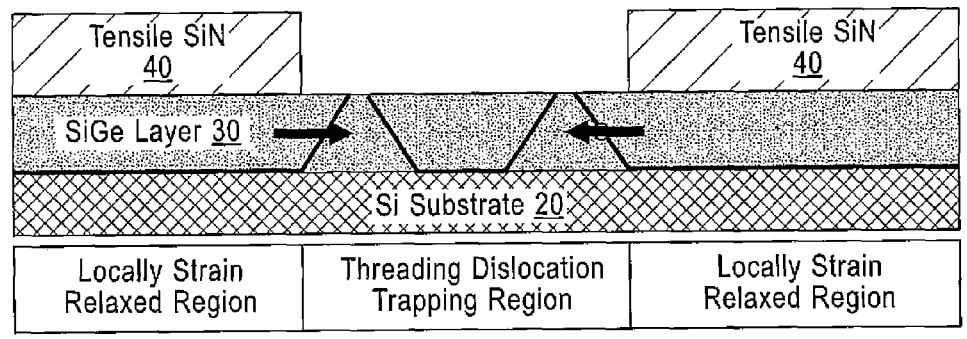

FIG. 8 shows the result of annealing the structure as in FIG. 5 to cause the misfit dislocations to propagate with the associated threading dislocations. In that portion of the SiGe epilayer 30 that underlies the aperture 40A, i.e., in that portion where no tensile stress is applied and thus no compressive stress exists, the propagating misfit and threading dislocations will become trapped (immobilized). In the surrounding SiGe layer 30 there will exist locally strain relaxed regions.

Figure 9:
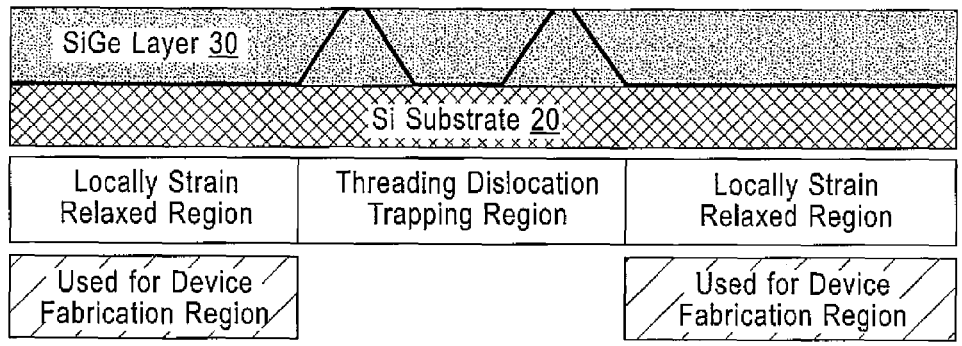

As is shown in FIG. 9, after removal of the SiN layer 40 the locally strain relaxed regions can be used as active device fabrication regions wherein transistors (e.g., P-type and N-type FINFETs) are formed. The threading dislocation trapping region of the SiGe layer 30 can also be used if desired but preferably for purposes other than active device fabrication.

For example, a layer of oxide or nitride could be applied over the threading dislocation trapping region and components/structures, such as capacitors and/or interconnects, could be formed on or in the oxide or nitride layer. In another embodiment the threading dislocation trapping region could be placed in a region where the wafer will be scribed (cut) to separate the wafer into sub-wafers (e.g., individual die).

Figure 10:
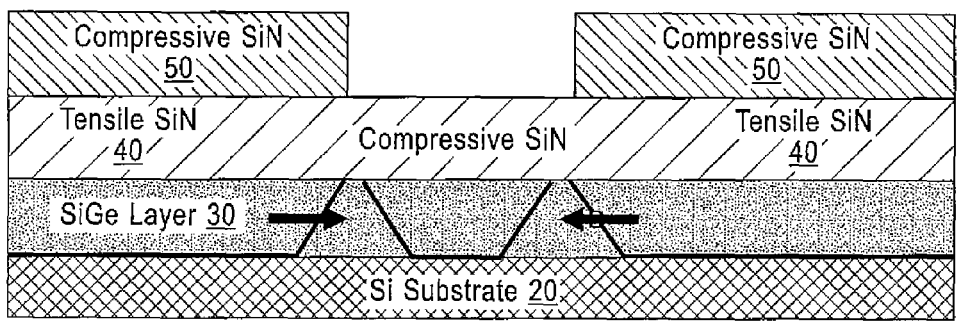

The dual stress liner patterning (tensile and compressive) and annealing embodiment will now be described. Processing begins in a manner compatible with the steps shown in FIGS. 3 and 4. FIG. 10 shows a result of the deposition of the tensile silicon nitride layer 40 with the aperture 40A (as in FIG. 7), followed by the deposition of a compressive silicon nitride layer 50 over the tensile silicon nitride layer 40 and into the aperture 40A.

Figure 11:
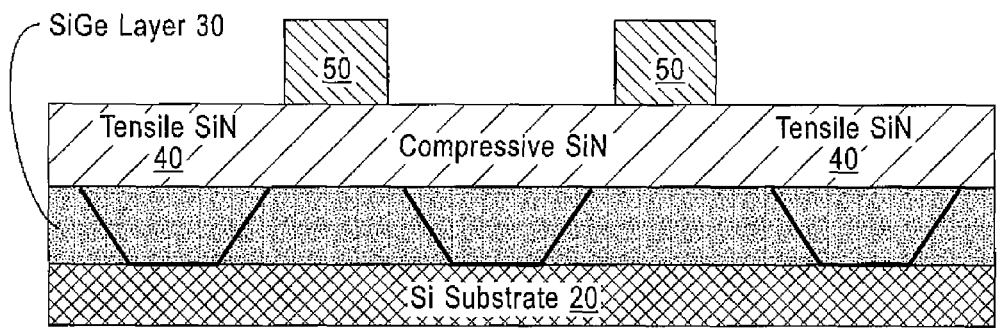

FIG. 11 shows the selective removal of the compressive silicon nitride layer 50 except for within the aperture 40A region.

Figure 12:
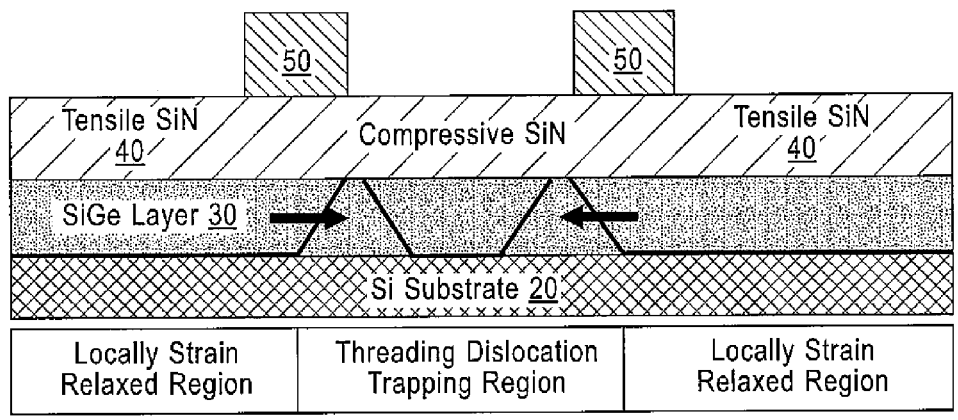

FIG. 12 shows the result of annealing the structure as in FIG. 5 to cause the misfit dislocations to propagate with the associated threading dislocations. In that portion of the SiGe substrate 30 that underlies the compressive silicon nitride layer 50 has a compressive stress applied thereto and as a result the propagating misfit and threading dislocations will become trapped (immobilized) in this portion. In the surrounding SiGe layer 30 there will exist the locally strain relaxed regions.

Figure 13:
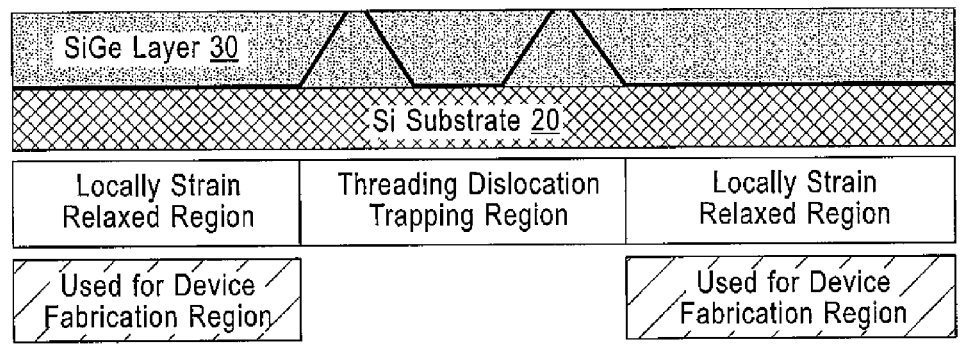

As is shown in FIG. 13, after removal of the SiN layer 40 and the compressive SiN layer 50, the locally strain relaxed regions can be used as the active device fabrication regions. As was discussed above with respect to FIG. 9, the threading dislocation trapping region of the SiGe layer 30 can also be used if desired for purposes other than for active device fabrication.

Figure 14:
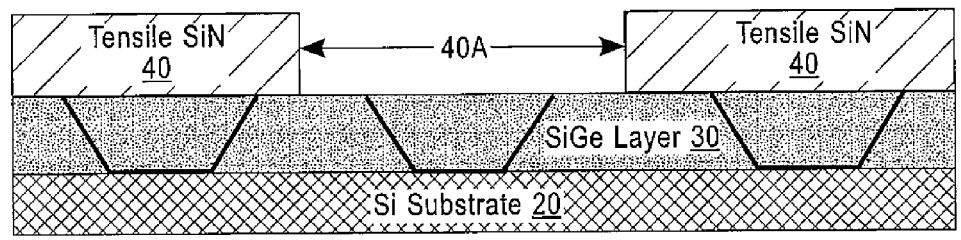

The tensile SiN patterning, implantation and annealing embodiment will now be described. Processing begins in a manner compatible with the steps shown in FIGS. 3 and 4. FIG. 14 shows a result of the deposition of the tensile silicon nitride layer 40 with the aperture 40A (as in FIG. 7).

Figure 15:
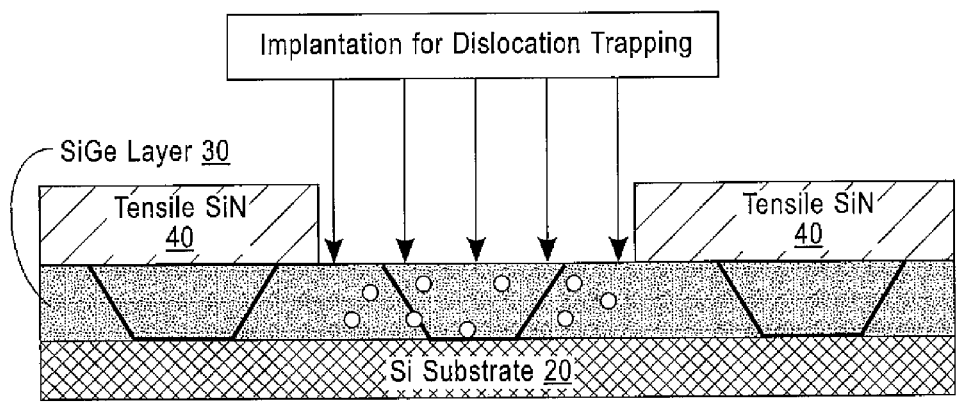

FIG. 15 shows an ion implant operation. The ions, such as Nitrogen, Oxygen, Phosphorous or, most preferably, Carbon, are implanted into the SiGe layer 30 through the aperture 40A. In some embodiments the surrounding layer of SiN 40 can serve as a self-aligned implant mask for the implanted ion species. The use of Carbon is preferred as it is desirable to prevent excessive implant damage and Carbon serves as an effective interstitial implant species for SiGe.

Figure 16:
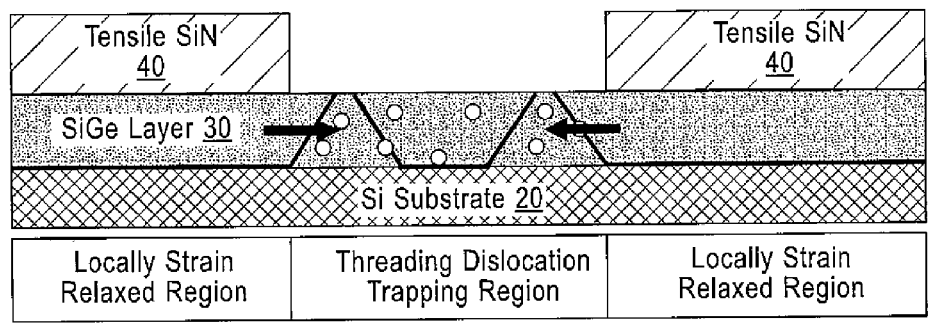

FIG. 16 shows the result of annealing the structure as in FIG. 5 to cause the misfit dislocations to propagate with the associated threading dislocations. In that portion of the SiGe substrate 30 that was implanted the propagating misfit and threading dislocations will become trapped (immobilized). In the surrounding SiGe layer 30 there will exist the locally strain relaxed regions.

Figure 17:
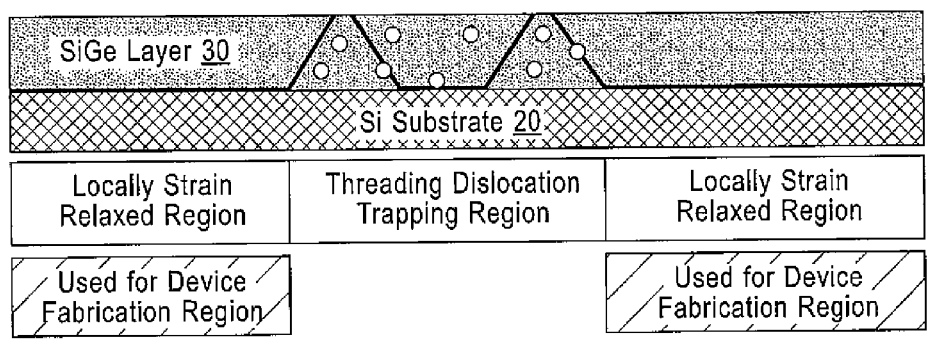

FIG. 17 illustrates, after removal of the SiN layer 40, that the locally strain relaxed regions can be used as the active device fabrication regions. As was discussed above with respect to FIG. 9, the threading dislocation trapping region of the SiGe layer 30, which also contains the implanted ion species, can be used if desired for purposes other than for active device fabrication.

It is noted that any one of the structures shown in FIGS. 3-17 could be viewed as an intermediate structure formed during the overall process of providing FINFETs and other active and/or passive devices.

It is to be understood that although the exemplary embodiments discussed above with reference to FIGS. 3-17 can be used with common variants of the FET device including, e.g., FET devices with multi-fingered FIN and/or gate structures and FET devices of varying gate width and length.

Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc., having contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and material removal processes may be used by those skilled in the art. Further, the exemplary embodiments are not intended to be limited to only those semiconductor materials, layer thicknesses, implant species and the like that were specifically disclosed above. Any and all such and similar modifications of the teachings of this invention will still fall within the scope of this invention.

What is claimed is:

1. A method, comprising:
   forming a multilayered structure by providing a substrate having a semiconductor layer disposed on a top surface thereof, the semiconductor layer containing misfit dislocations and associated threading dislocations, and depositing a tensile strained dielectric layer on a top surface of the semiconductor layer to induce a compressive strain in the semiconductor layer;

annealing the multilayered structure to cause the misfit dislocations and associated threading dislocations to propagate within the semiconductor layer; and immobilizing the propagating misfit dislocations and associated threading dislocations in a predetermined portion of the semiconductor layer;

further comprising forming an aperture in the tensile strained dielectric layer and filling the aperture with compressively strained dielectric material, where the predetermined portion of the semiconductor layer is a portion that underlies the aperture that is filled with the compressively strained dielectric material.

2. The method of claim 1, where the semiconductor layer is comprised of at least one of Si, Ge, SiGe and a Group III-V semiconductor material.

3. The method of claim 1, where the tensile strained dielectric layer is comprised of Silicon Nitride.

4. The method of claim 1, further comprising removing the tensile strained dielectric layer from the top surface of the semiconductor layer.

5. The method of claim 1, where portions of the semiconductor layer that surround the predetermined portion are locally strain relaxed portions and define active device fabrication regions.

6. The method of claim 5, further comprising forming at least one of non-active components and interconnects in and above the predetermined portion of the semiconductor layer.

7. The method of claim 5, further comprising scribing the substrate and semiconductor layer through the predetermined portion of the semiconductor layer.

8. A method, comprising:

forming a multilayered structure by providing a substrate having a semiconductor layer disposed on a top surface thereof, the semiconductor layer containing misfit dislocations and associated threading dislocations, and depositing a tensile strained dielectric layer on a top surface of the semiconductor layer to induce a compressive strain in the semiconductor layer;

annealing the multilayered structure to cause the misfit dislocations and associated threading dislocations to propagate within the semiconductor layer; and immobilizing the propagating misfit dislocations and associated threading dislocations in a predetermined portion of the semiconductor layer;

further comprising forming an aperture in the tensile strained dielectric layer and implanting Carbon ions into the semiconductor layer through the aperture, where the predetermined portion of the semiconductor layer is a Carbon implanted portion that underlies the aperture.

9. The method of claim 8, where the semiconductor layer is comprised of at least one of Si, Ge, SiGe and a Group III-V semiconductor material.

10. The method of claim 8, where the tensile strained dielectric layer is comprised of Silicon Nitride.

11. The method of claim 8, further comprising removing the tensile strained dielectric layer from the top surface of the semiconductor layer.

12. The method of claim 8, where portions of the semiconductor layer that surround the predetermined portion are locally strain relaxed portions and define active device fabrication regions.

13. The method of claim 12, further comprising forming at least one of non-active components and interconnects in and above the predetermined portion of the semiconductor layer.

14. The method of claim 12, further comprising scribing the substrate and semiconductor layer through the predetermined portion of the semiconductor layer.

\* \* \* \* \*